United States Patent
Asaba et al.

(10) Patent No.: US 10,741,395 B2
(45) Date of Patent: Aug. 11, 2020

(54) METHOD FOR MANUFACTURING SEMICONDUCTOR DEVICE

(71) Applicant: Kabushiki Kaisha Toshiba, Minato-ku (JP)

(72) Inventors: Shunsuke Asaba, Kawasaki (JP); Ryosuke Iijima, Setagaya (JP); Yukio Nakabayashi, Yokohama (JP); Shigeto Fukatsu, Yokohama (JP); Toshihide Ito, Shibuya (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 131 days.

(21) Appl. No.: 15/893,950

(22) Filed: Feb. 12, 2018

(65) Prior Publication Data

US 2018/0330949 A1    Nov. 15, 2018

(30) Foreign Application Priority Data

May 12, 2017    (JP) .................... 2017-095922

(51) Int. Cl.
*H01L 21/04* (2006.01)
*H01L 21/02* (2006.01)
(Continued)

(52) U.S. Cl.
CPC ...... *H01L 21/049* (2013.01); *H01L 21/02164* (2013.01); *H01L 21/02266* (2013.01);
(Continued)

(58) Field of Classification Search
CPC .......... H01L 21/049; H01L 21/02164; H01L 21/02271; H01L 21/02337; H01L 21/02266

See application file for complete search history.

(56) References Cited

U.S. PATENT DOCUMENTS 4,784,975 A * 11/1988 Hofmann .......... H01L 21/02238
148/DIG. 4
2004/0058557 A1 * 3/2004 Eisele ................. H01L 21/0214
438/769
(Continued)

FOREIGN PATENT DOCUMENTS

JP    2008/147365 A    6/2008
JP    2011/82454 A     4/2011
(Continued)

OTHER PUBLICATIONS

Richard Heihachiro Kikuchi, et al., "Fabrication of SiO2/4H—SiC (0001) interface with nearly ideal capacitance-voltage characteristics by thermal oxidation," Applied Physics Letters 105, 2014, 5 Pages.

(Continued)

*Primary Examiner* — Peniel M Gumedzoe
(74) *Attorney, Agent, or Firm* — Oblon, McClelland, Maier & Neustadt, L.L.P.

(57) ABSTRACT

According to one embodiment, a method for manufacturing a semiconductor device is disclosed. The method can include performing a first heat treatment of a first film at a first temperature not less than 500° C. and not more than 900° C. in a first atmosphere including oxygen. The first film includes silicon and oxygen and is deposited on a semiconductor member including silicon carbide. The method can include performing, after the first heat treatment, a second heat treatment of the first film at a second temperature not less than 1200° C. but less than 1400° C. in a second atmosphere including nitrogen.

11 Claims, 5 Drawing Sheets

(51) Int. Cl.
    *H01L 29/16*     (2006.01)
    *H01L 29/66*     (2006.01)
    *H01L 29/51*     (2006.01)
    *H01L 29/78*     (2006.01)
    *H01L 29/94*     (2006.01)

(52) U.S. Cl.
    CPC .. *H01L 21/02271* (2013.01); *H01L 21/02337* (2013.01); *H01L 29/1608* (2013.01); *H01L 29/518* (2013.01); *H01L 29/6606* (2013.01); *H01L 29/66068* (2013.01); *H01L 29/7802* (2013.01); *H01L 29/66181* (2013.01); *H01L 29/66666* (2013.01); *H01L 29/94* (2013.01)

(56) References Cited

U.S. PATENT DOCUMENTS

| | | | |
|---|---|---|---|
| 2006/0054891 A1* | 3/2006 | Chu | H01L 21/76254 257/65 |
| 2008/0020514 A1* | 1/2008 | Okuda | H01L 21/76254 438/115 |
| 2009/0227100 A1* | 9/2009 | Yamanobe | H01L 21/049 438/586 |
| 2017/0069487 A1* | 3/2017 | Watanabe | C23C 16/455 |

FOREIGN PATENT DOCUMENTS

| | | |
|---|---|---|
| JP | 2012/227336 A | 11/2012 |
| WO | 2011/111627 A1 | 9/2011 |

OTHER PUBLICATIONS

Atthawut Chanthaphan, et al., "Study of SiO2/4H—SiC interface nitridation by post-oxidation annealing in pure nitrogen gas," AIP Advances 5, 2015, 8 Pages.

* cited by examiner

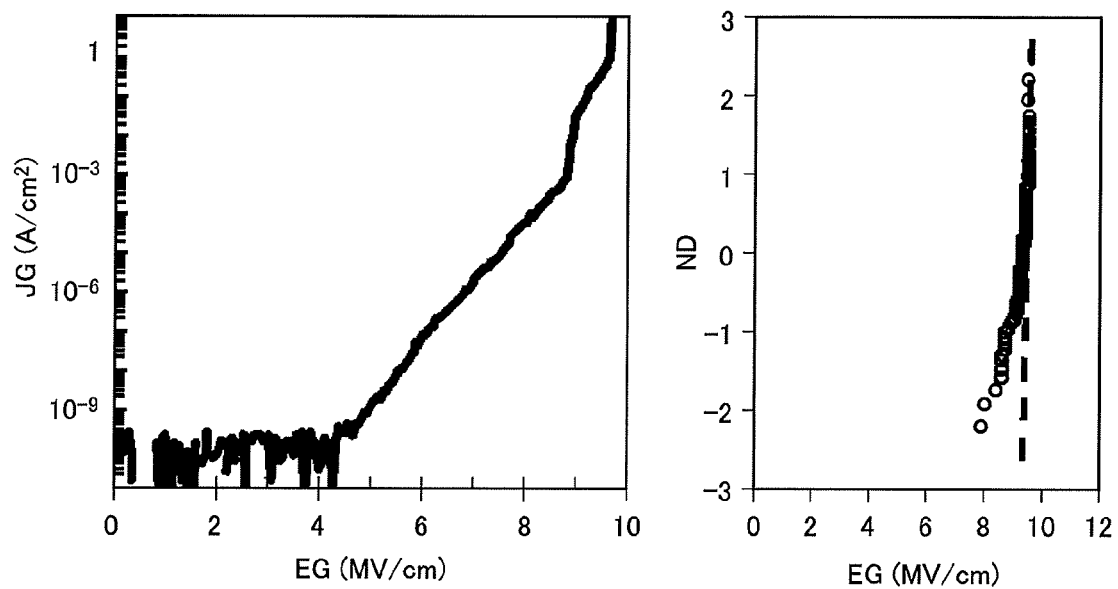
FIG. 9A
FIG. 9B
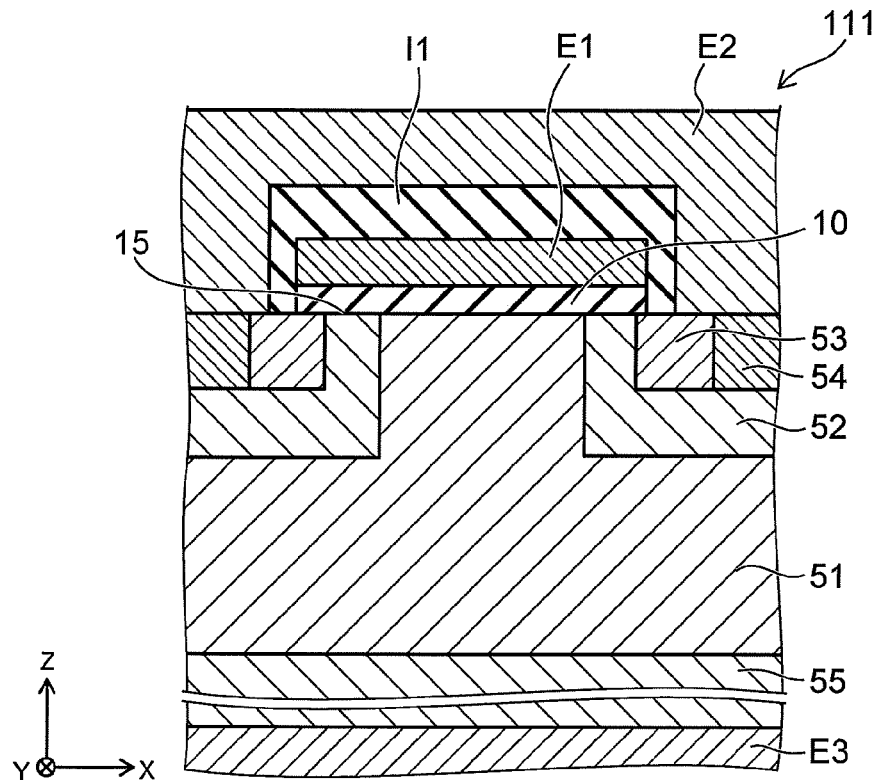
FIG. 10

METHOD FOR MANUFACTURING SEMICONDUCTOR DEVICE

CROSS-REFERENCE TO RELATED APPLICATIONS

This application is based upon and claims the benefit of priority from Japanese Patent Application No. 2017-095922, filed on May 12, 2017; the entire contents of which are incorporated herein by reference.

FIELD

Embodiments described herein relate generally to a method for manufacturing a semiconductor device.

BACKGROUND

There is a semiconductor device such as a transistor or the like that uses silicon carbide (SiC). In the semiconductor device, an insulating film of silicon oxide or the like is provided between an electrode (a conductive film) and a semiconductor film including silicon carbide. Good characteristics of the semiconductor device are desirable.

BRIEF DESCRIPTION OF THE DRAWINGS

FIG. 9A and FIG. 9B are graphs illustrating the characteristics of the semiconductor device according to the embodiment; and FIG. 10 is a schematic cross-sectional view illustrating a semiconductor device according to the embodiment.

DETAILED DESCRIPTION

Figure 1:
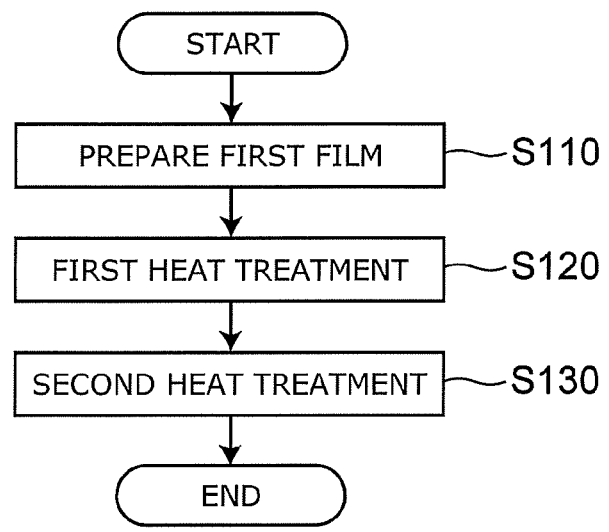
FIG. 1 is a flowchart illustrating a method for manufacturing a semiconductor device according to an embodiment.

According to one embodiment, a method for manufacturing a semiconductor device is disclosed. The method can include performing a first heat treatment of a first film at a first temperature not less than 500° C. and not more than 900° C. in a first atmosphere including oxygen. The first film includes silicon and oxygen and is deposited on a semiconductor member including silicon carbide. The method can include performing, after the first heat treatment, a second heat treatment of the first film at a second temperature not less than 1200° C. but less than 1400° C. in a second atmosphere including nitrogen.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

FIG. 1 is a flowchart illustrating a method for manufacturing a semiconductor device according to an embodiment.

Figure 2:
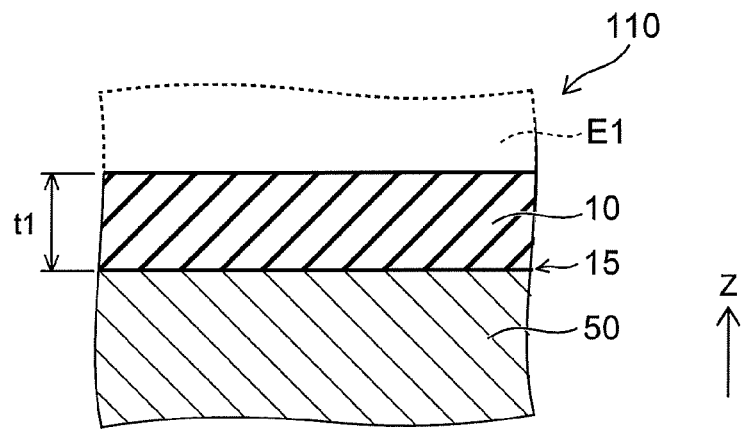
FIG. 2 is a schematic cross-sectional view illustrating the semiconductor device according to the embodiment.

FIG. 2 is a schematic cross-sectional view illustrating the semiconductor device according to the embodiment.

As shown in FIG. 1, the method for manufacturing the semiconductor device according to the embodiment includes preparing a first film (step S110), performing a first heat treatment (step S120), and performing a second heat treatment (step S130).

In the semiconductor device 110 as shown in FIG. 2, the first film 10 is provided on a semiconductor member 50. The semiconductor member 50 includes silicon carbide (SiC). The semiconductor member 50 includes, for example, 4H—SiC.

The first film 10 includes silicon and oxygen. The first film 10 is, for example, a silicon oxide film. The first film 10 is deposited on the semiconductor member 50. For example, the first film 10 is formed by chemical vapor deposition (CVD). The chemical vapor deposition may include atomic layer deposition (ALD). For example, the first film 10 may be formed by PVD (physical vapor deposition). The PVD includes at least one of vapor deposition or sputtering. The method for manufacturing the semiconductor device according to the embodiment may further include depositing the first film 10 on the semiconductor member 50 (one example of step S110).

The direction from the semiconductor member 50 toward the first film 10 is taken as a Z-axis direction. An interface 15 exists between the semiconductor member 50 and the first film 10.

A thickness t1 (the thickness before the first heat treatment) of the first film 10 is, for example, not less than 20 nm and not more than 60 nm. The thickness t1 is the length along the Z-axis direction. The first film 10 that has such a thickness t1 can be utilized as the gate insulating film of a transistor. Appropriate insulative properties, appropriate electrical characteristics (e.g., the threshold voltage, etc.), and good reliability are obtained by such a thickness t1.

A first conductive film E1 may be further provided in the semiconductor device 110. The first conductive film E1 is, for example, a gate electrode. The first heat treatment and the second heat treatment recited above are performed before forming the first conductive film E1.

Examples of the first heat treatment and the second heat treatment will now be described.

Figure 3:
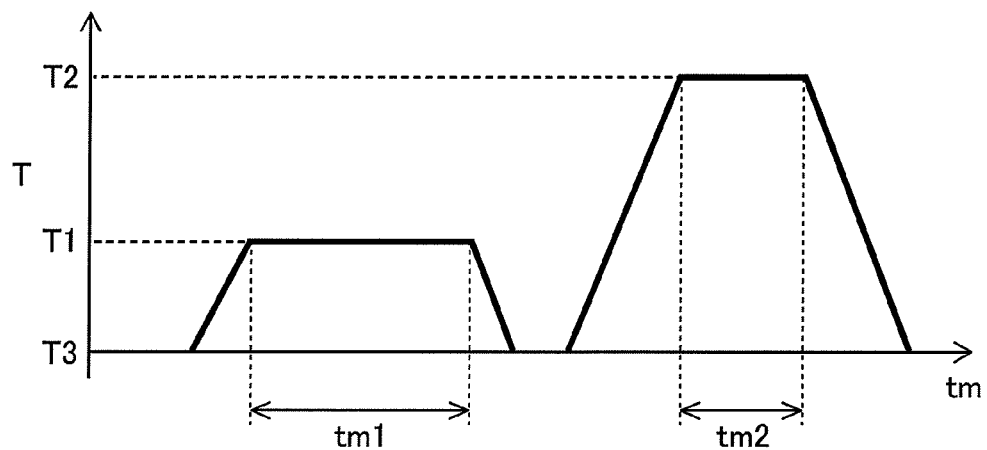
FIG. 3 is a schematic view illustrating the method for manufacturing the semiconductor device according to the embodiment.

FIG. 3 is a schematic view illustrating the method for manufacturing the semiconductor device according to the embodiment.

The horizontal axis of FIG. 3 is a time tm. The vertical axis is a temperature T.

In the first heat treatment, heat treatment of the first film 10 deposited on the semiconductor member 50 is performed at a first temperature T1 in a first atmosphere including oxygen. The first temperature T1 is, for example, not less than 500° C. and not more than 900° C. In the first heat treatment, for example, heat treatment of a patterning body including the semiconductor member 50 and the first film 10 is performed at the first temperature T1 inside a chamber including oxygen ($O_2$). The temperature of the patterning body before the first heat treatment is a third temperature T3. The third temperature T3 is lower than the first temperature T1. The third temperature T3 may be, for example, room temperature (e.g., not less than 20° C. and not more than 40° C.). In the first heat treatment, the time (a first heat treatment time tm1) that the temperature T substantially is the first temperature T1 is, for example, not less than 10 minutes and not more than 20 hours. A second temperature T2 and the first temperature T1 recited above are temperatures at the position of the processing body (the substrate such as the semiconductor member 50, etc.) inside the chamber. The temperature of the processing body substantially matches the temperature at the position of the processing body inside the chamber. The temperature at the position of the processing body inside the chamber can be sensed using a sensing element such as a thermocouple, etc.

The second heat treatment is performed after the first heat treatment. In the second heat treatment, heat treatment of the first film 10 is performed at the second temperature T2 in a second atmosphere including nitrogen. The second temperature T2 is higher than the first temperature T1. The second temperature T2 is, for example, not less than 1200° C. but less than 1400° C. The second temperature T2 may be, for example, not less than 1200° C. and not more than 1350° C. In the second heat treatment, for example, heat treatment of the patterning body after the first heat treatment is performed at the second temperature T2 inside a chamber filled with nitrogen ($N_2$). In the second heat treatment, the time (a second heat treatment time tm2) that the temperature T substantially is the second temperature T2 is, for example, not less than 10 minutes and not more than 20 hours.

Thus, the atmospheres and the temperatures are respectively different between the first heat treatment and the second heat treatment. The chamber of the first heat treatment and the chamber of the second heat treatment may be different from each other. Thereby, high productivity is obtained easily for the chambers. In the embodiment, the first heat treatment and the second heat treatment may be performed in one chamber.

In the example, the temperature of the first film 10 is set to the third temperature T3 between the first heat treatment and the second heat treatment. For example, in the case where the first heat treatment and the second heat treatment are performed in mutually-different chambers, the temperature of the first film 10 is the third temperature T3 between the first heat treatment and the second heat treatment.

In the embodiment, the second atmosphere substantially does not include oxygen. Or, in the case where the second atmosphere includes oxygen, the concentration of oxygen included in the second atmosphere is, for example, 3 vol % (volume percent) or less. The concentration of oxygen included in the second atmosphere may be 0.001 vol % or less. The concentration (the purity) of nitrogen in the gas used in the second atmosphere may be, for example, 99.9999 vol % or more.

Thus, it was found that the first film 10 (the silicon oxide film) having good characteristics is obtained by performing the first heat treatment in the first atmosphere including oxygen and the second heat treatment in the second atmosphere including nitrogen.

For example, the concentration of nitrogen included in the first film 10 after the second heat treatment is not less than $1 \times 10^{20}$ cm$^{-3}$ and not more than $1 \times 10^{22}$ cm$^{-3}$. Such a high concentration of nitrogen exists at the vicinity of the interface 15 between the first film 10 and the semiconductor member 50. The distance between the interface 15 and the region containing a high concentration of nitrogen is, for example, not less than 0 nm and not more than 10 nm.

By the interface or the vicinity of the interface containing nitrogen, the defect density of the interface or the interface vicinity can be low. Thereby, the characteristics of the semiconductor device can be improved.

Examples of characteristics of the semiconductor device 110 including the first film 10 made using the method recited above will now be described. The semiconductor device 110 is a MOS transistor. The thickness t1 of the first film 10 is about 45 nm for the sample described below. The first temperature T1 is 700° C. The first heat treatment time tm1 is 2 hours. The second temperature T2 is 1300° C. The second heat treatment time tm2 is 1 hour.

Figure 4:
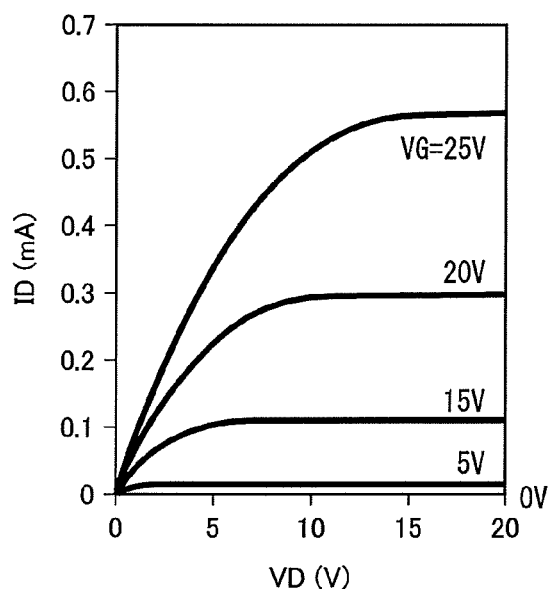
FIG. 4 is a graph illustrating a characteristic of the semiconductor device.

FIG. 4 is a graph illustrating a characteristic of the semiconductor device.

FIG. 4 shows the measurement results of the voltage-current characteristic of a sample 110a (a transistor) made using the method recited above. The horizontal axis of FIG. 4 is a drain voltage VD (V). The vertical axis is a drain current ID (mA). The characteristic when a gate voltage VG is 5 V, 15 V, 20 V, and 25 V is illustrated in FIG. 4. As shown in FIG. 4, a good characteristic is obtained.

Figure 5:
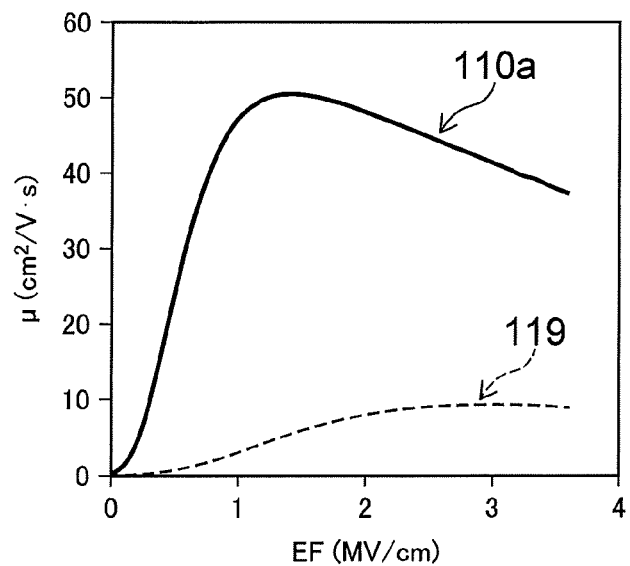
FIG. 5 is a graph illustrating a characteristic of the semiconductor device.

FIG. 5 is a graph illustrating a characteristic of the semiconductor device.

FIG. 5 shows the evaluation results of a mobility μ of the sample 110a. The horizontal axis of FIG. 5 is an electric field strength EF (MV/cm) of the gate. The vertical axis is the mobility μ (cm$^2$/(V·s)). The characteristic of a sample 119 of a first reference example also is shown in FIG. 5. In the sample 119, the first heat treatment recited above is not performed; and only the second heat treatment is performed.

It can be seen from FIG. 5 that the mobility μ is low for the sample 119 of the first reference example. Conversely, for the sample 110a, a high mobility μ (e.g., about 50 cm$^2$/(V·s)) is obtained. Thus, a high mobility μ is obtained by the combination of the first heat treatment and the second heat treatment recited above.

Figure 6:
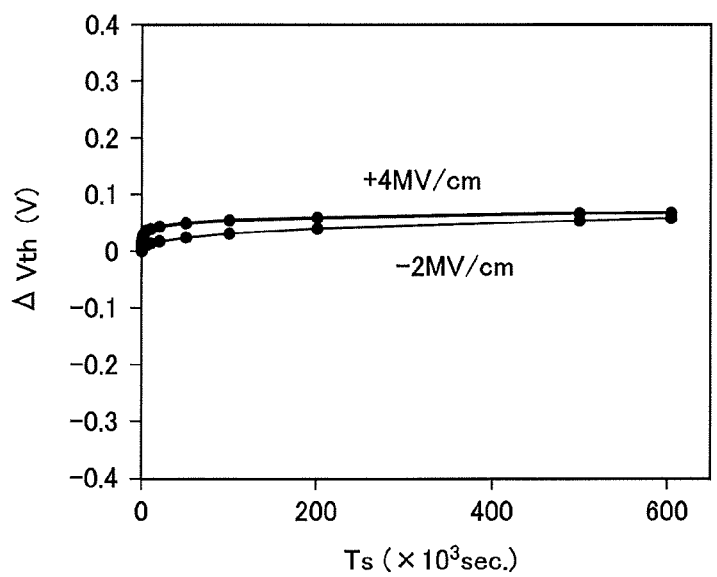
FIG. 6 is a graph illustrating a characteristic of the semiconductor device.

FIG. 6 is a graph illustrating a characteristic of the semiconductor device.

FIG. 6 illustrates the evaluation results of the shift of the threshold of the sample 110a. In the evaluation, a direct current electric field is applied between the semiconductor member 50 and the first conductive film E1 (the gate electrode) of the sample 110a. A shift ΔVth of the threshold voltage for the elapse of an application time Ts of the direct current electric field is evaluated. The horizontal axis of FIG. 6 is the application time Ts ($10^3$ sec (seconds)). The vertical axis is the shift ΔVth (V) of the threshold voltage. In the example, the characteristics are shown for when the direct current electric field is +4 MV/cm and −2 MV/cm. The temperature when applying the direct current electric field is 175° C.

As shown in FIG. 6, the shift ΔVth of the threshold voltage is not more than about 70 mV for the sample 110a. Thus, a small shift ΔVth of the threshold voltage is obtained for the combination of the first heat treatment and the second heat treatment recited above. As shown in FIG. 6, a small shift ΔVth of the threshold voltage is obtained when the direct current electric field is positive or negative.

Thus, it is considered that the high mobility μ and the small shift ΔVth of the threshold voltage are obtained for the sample 110a obtained using the method recited above because a high concentration of nitrogen is introduced to the vicinity of the interface between the first film 10 and the semiconductor member 50.

Figure 7:
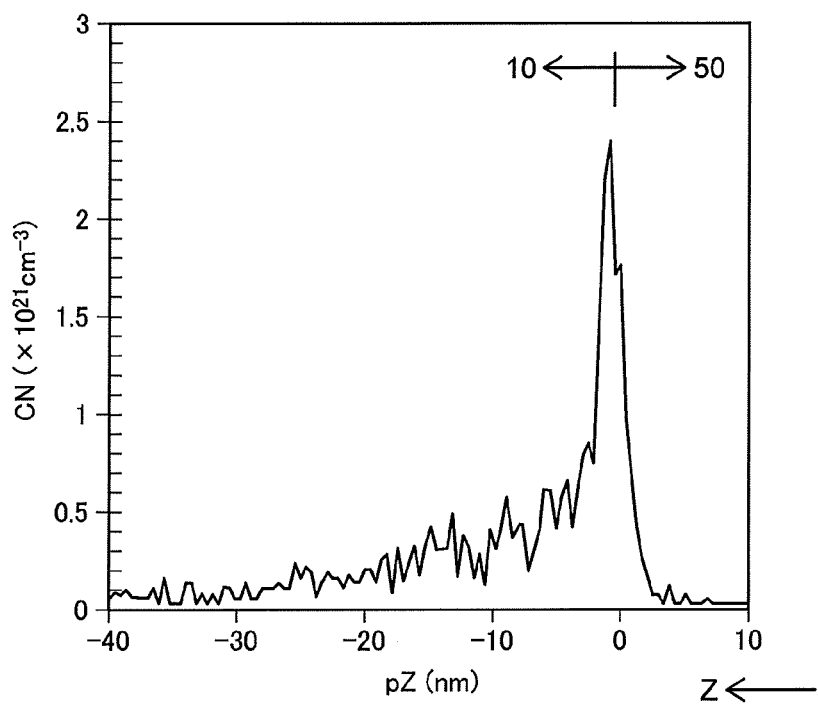
FIG. 7 is a graph illustrating analysis results of the sample.

FIG. 7 is a graph illustrating analysis results of the sample.

FIG. 7 shows the analysis results using secondary ion mass spectrometry (SIMS) for the sample 110a recited above. The horizontal axis of FIG. 7 is a position pZ (the depth) in the Z-axis direction. The vertical axis is a concentration CN ($\times 10^{21}$ cm$^{-3}$) of nitrogen. It can be seen from FIG. 7 that a high concentration CN of nitrogen is observed for the sample 110a at the interface vicinity (the region having the interface 15) between the semiconductor member 50 and the first film 10. In the example, the concentration CN (the peak concentration) of nitrogen at the interface vicinity is about $2.4 \times 10^{21}$ cm$^{-3}$. Thus, a high concentration CN (e.g., not less than $1 \times 10^{20}$ cm$^{-3}$ and not more than $1 \times 10^{22}$ cm$^{-3}$) of nitrogen can be observed for the sample 110a made using the manufacturing method according to the embodiment.

On the other hand, the peak concentration of nitrogen is about $1 \times 10^{19}$ cm$^{-3}$ for the sample 119 (the first reference example) recited above on which the first heat treatment is not performed.

Thus, the peak concentration of nitrogen can be high by using the combination of the first heat treatment and the second heat treatment.

On the other hand, there is a second reference example in which heat treatment of a silicon oxide film formed on a semiconductor including silicon carbide is performed in an atmosphere including NO gas. In the second reference example, the peak concentration of nitrogen is about $1 \times 10^{21}$ cm$^{-3}$. However, in the second reference example, the mobility μ is about 30 cm$^2$/(V·s).

Conversely, a high mobility μ of about 50 cm$^2$/(V·s) is obtained for the sample 110a recited above. It is considered that this is because the defect density of the sample 110a is low compared to the second reference example.

Further, the trap density can be lower by using the combination of the first heat treatment and the second heat treatment. An interface trap density Dit of the sample 110a is about $4 \times 10^{11}$ (1/cm$^2$ eV). The interface trap density Dit is the trap density at an energy 0.2 eV lower than the lower end of the conduction band. On the other hand, the interface trap density Dit is about $22 \times 10^{11}$ (1/cm$^2$ eV) for the sample 119 (the first reference example) recited above. Thus, in the sample 110a, the interface trap density Dit can be low.

There is a third reference example in which heat treatment of a silicon oxide film (having a thickness of 15 nm) formed by dry oxidation on silicon carbide is performed in a nitrogen (N$_2$) atmosphere. For the third reference example, the interface trap density Dit is about $14 \times 10^{11}$ (1/cm$^2$ eV) in the case where the temperature of the heat treatment in the nitrogen atmosphere is 1300° C. For the third reference example, the interface trap density Dit is about $9 \times 10^{11}$ (1/cm$^2$ eV) in the case where the temperature of the heat treatment in the nitrogen atmosphere is 1350° C. For the third reference example, the interface trap density Dit is about $6 \times 10^{11}$ (1/cm$^2$ eV) the case where the temperature of the heat treatment in the nitrogen atmosphere is 1400° C.

The interface trap density Dit of the sample 110a is lower than the interface trap density Dit of such a third reference example.

Thus, an unconventionally low interface trap density Dit can be obtained by using the first heat treatment and the second heat treatment.

Figure 8:
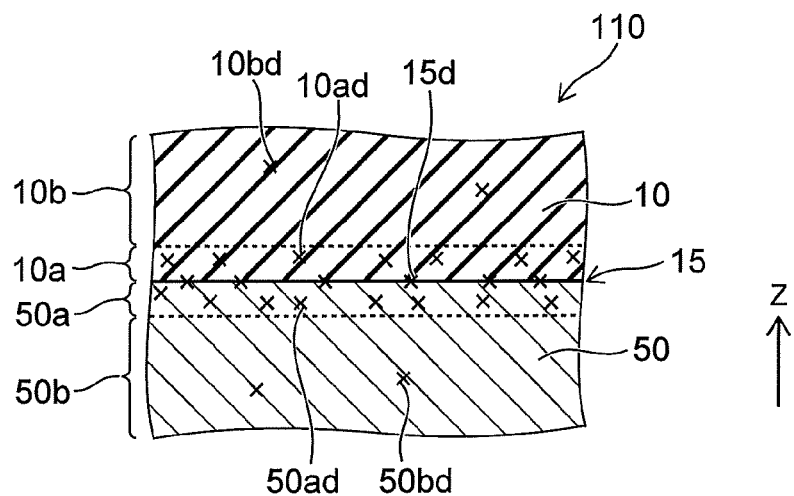
FIG. 8 is a schematic view illustrating defects of the semiconductor device.

FIG. 8 is a schematic view illustrating defects of the semiconductor device.

As shown in FIG. 8, the first film 10 includes an interface vicinity region 10a and a bulk region 10b. The interface vicinity region 10a is positioned between the bulk region 10b and the semiconductor member 50. On the other hand, the semiconductor member 50 includes an interface vicinity region 50a and a bulk region 50b. The interface vicinity region 50a is positioned between the bulk region 50b and the first film 10.

It is considered that interface defects 15d exist at the interface 15 between the semiconductor member 50 (SiC) and the first film 10 (the silicon oxide). It is considered that interface vicinity defects 10ad exist in the interface vicinity region 10a of the first film 10. It is considered that bulk region defects 10bd exist in the bulk region 10b of the first film 10. It is considered that interface vicinity defects 50ad exist in the interface vicinity region 50a of the semiconductor member 50. There are also cases where bulk region defects 50bd exist in the bulk region 50b of the semiconductor member 50.

It is considered that the bulk region defects 50bd are substantially dependent on the formation conditions of the semiconductor member 50. On the other hand, it is considered that the interface defects 15d, the interface vicinity defects 10ad, the bulk region defects 10bd, and the interface vicinity defects 50ad are affected by the heat treatment after the formation of the first film 10 and the first film 10. It is considered that the interface trap density Dit recited above corresponds to the density of the interface defects 15d. Practically, it is desirable to reduce the interface vicinity defects 10ad, the bulk region defects 10bd, and the interface vicinity defects 50ad in addition to the interface defects 15d.

It is considered that the interface defects 15d, the interface vicinity defects 10ad, the bulk region defects 10bd, and the interface vicinity defects 50ad are few in the sample 110a according to the embodiment. Thereby, it is considered that the small shift ΔVth of the threshold voltage (not more than about 70 mV) is obtained. It is considered that a high mobility μ (about 50 cm$^2$/(V·s) is obtained because the interface defects 15d, the interface vicinity defects 10ad, and the interface vicinity defects 50ad are few.

Conversely, for the third reference example recited above, it is considered that the interface defects 15d and the interface vicinity defects 10ad are plentiful in the case where the temperature of the heat treatment in the nitrogen atmosphere is 1300° C. Therefore, the mobility μ is low. On the other hand, for the third reference example, in the case where the temperature of the heat treatment in the nitrogen atmosphere is high, i.e., 1400° C., the first film 10 (the silicon oxide film) degrades; and the bulk region defects 10bd are plentiful. Therefore, the shift ΔVth of the threshold voltage becomes large.

Conversely, according to the manufacturing method according to the embodiment as recited above, a small shift ΔVth of the threshold voltage and a high mobility μ are obtained.

In the embodiment, the first film 10 (the silicon oxide) is deposited on the semiconductor member 50 by CVD, etc. The density of the deposited first film 10 is relatively low. For example, silicon oxide that is obtained by dry oxidation is dense. Compared to the silicon oxide obtained by dry oxidation, it is considered that the oxidization easily penetrates the first film 10 for the first film 10 deposited by CVD, etc. For example, it is considered that the oxygen easily reaches the interface 15 between the semiconductor member 50 and the first film 10 due to the first heat treatment in the first atmosphere including oxygen. For example, it is considered that an activated region (e.g., a precursor of reactions) forms easily at the semiconductor member 50 at the vicinity of the interface 15. Then, in the second heat treatment performed after the first heat treatment, nitrogen passes through the first film 10 and easily reaches the vicinity of the interface 15. Therefore, the concentration CN of nitrogen at the vicinity of the interface 15 can be high. The nitrogen collects in the activated region; and a high concentration exists at the vicinity of the interface 15. At this time, the second heat treatment is performed at the high second temperature T2 in nitrogen (substantially not including oxygen). Thereby, nitrogen is included concentratively in the vicinity of the interface 15; and the defects at the vicinity of the interface 15 decrease efficiently.

In the embodiment, the first temperature T1 of the first heat treatment is lower than the second temperature T2 of the second heat treatment. Because the first temperature T is not excessively high, for example, activation at the vicinity of the interface 15 occurs; and oxidization of the region (e.g., inside the bulk of the base body (semiconductor member 50) separated from the interface 15 is suppressed. For example, if the first temperature T1 is as high as the second temperature T2, for example, a low quality thermal oxide film is formed; and the characteristics of the element degrade easily.

By performing the first heat treatment in the embodiment, a high concentration of nitrogen can be introduced to the vicinity of the interface 15 without using an ultra-high temperature (e.g., exceeding 1400° C.). Because an ultra-high temperature is not used, for example, the occurrence of damage such as oxygen deficiency, etc., in the first film 10 can be suppressed.

In the manufacturing method according to the embodiment, the concentration of oxygen in the first atmosphere of the first heat treatment is, for example, 5 vol % or more. The manufacturing method may further include forming the conductive film (the first conductive film E1) on the first film 10 after the second heat treatment. The first conductive film E1 is, for example, a gate electrode. The first conductive film E1 may be the electrode of a MOS capacitor element.

Examples of characteristics of the leakage current will now be described for the structure formed using the manufacturing method according to the embodiment. In the evaluation of the leakage current, the samples are MOS capacitor elements. The capacitor elements include the semiconductor member 50, the first film 10, and the first conductive film E1 (referring to FIG. 2). For the capacitor elements, the first heat treatment and the second heat treatment recited above are performed on a structure body including the semiconductor member 50 and the first film 10.

FIG. 9A and FIG. 9B are graphs illustrating the characteristics of the semiconductor device according to the embodiment.

In FIG. 9A and FIG. 9B, the horizontal axis is an electric field EG (MV/cm) applied to the capacitor elements. The vertical axis of FIG. 9A is a current density JG (A/cm$^2$). For the multiple elements, the characteristic shown in FIG. 9A is evaluated; and the breakdown electric field of each of the multiple elements is derived from the evaluation results. The characteristic of FIG. 9B is obtained by statistically processing the results. FIG. 9B shows the distribution of the breakdown electric field for the multiple elements. The vertical axis of FIG. 9B is a standard deviation ND.

As shown in FIG. 9A, an extremely low current density JG is obtained for the capacitor element made using the manufacturing method according to the embodiment. For example, the first film 10 can be used as a gate insulating film. As shown in FIG. 9B, the breakdown electric field is about 9.2 MV/cm.

FIG. 10 is a schematic cross-sectional view illustrating a semiconductor device according to the embodiment.

As shown in FIG. 10, the semiconductor device 111 includes a first semiconductor region 51 of a first conductivity type, a second semiconductor region 52 of a second conductivity type, a third semiconductor region 53 of the first conductivity type, a fourth semiconductor region 54 of the second conductivity type, the first film 10, the first conductive film E1, a second conductive film E2, a third conductive film E3, and an insulating film I1. The semiconductor device 111 is a transistor. The semiconductor regions recited above include, for example, silicon carbide. The second semiconductor region 52 corresponds to the semiconductor member 50 recited above. For example, the first film 10 corresponds to a gate insulating film. The first conductive film E1 corresponds to a gate electrode. For example, the second conductive film E2 corresponds to a source electrode. For example, the third conductive film E3 corresponds to a drain electrode. A substrate 55 (a SiC substrate) is provided in the example.

One direction perpendicular to the Z-axis direction is an X-axis direction. A direction perpendicular to the Z-axis direction and the X-axis direction is a Y-axis direction.

In the example, the first conductive film E1 is provided between the second conductive film E2 and the third conductive film E3 in the Z-axis direction. The substrate 55 is positioned between the first conductive film E1 and the third conductive film E3. A portion of the first semiconductor region 51 is positioned between the first conductive film E1 and the substrate 55. The first film 10 is positioned between the first conductive film E1 and the portion of the first semiconductor region 51. The insulating film I1 is provided between the second conductive film E2 and the first conductive film E1. The insulating film I1 insulates between the second conductive film E2 and the first conductive film E1.

The second semiconductor region 52 is provided between another portion of the first semiconductor region 51 and a portion of the second conductive film E2. The third semiconductor region 53 and the fourth semiconductor region 54 are positioned between a portion of the second semiconductor region 52 and the portion of the second conductive film E2 recited above. The third semiconductor region 53 is positioned between the fourth semiconductor region 54 and a portion of the first semiconductor region 51 in the X-axis direction. A portion of the second semiconductor region 52 is positioned between the third semiconductor region 53 and the portion of the first semiconductor region 51. The third semiconductor region 53 and the fourth semiconductor region 54 have ohmic contacts with the second conductive film E2.

In the semiconductor device 111, a high mobility μ and a small shift ΔVth of the threshold voltage are obtained.

According to the embodiment, a method for manufacturing a semiconductor device can be provided in which the characteristics can be improved.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as semiconductor regions, first films, conductive films, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all methods for manufacturing semiconductor devices practicable by an appropriate design modification by one skilled in the art based on the methods for manufacturing semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method for manufacturing a semiconductor device, comprising:

performing a first heat treatment of a first film at a first temperature not less than 500° C. and not more than 900° C. in a first atmosphere including oxygen, the first film including silicon and oxygen and being on a semiconductor member including silicon carbide; and performing, after the first heat treatment, a second heat treatment of the first film at a second temperature not less than 1200° C. but less than 1400° C. in a second atmosphere including nitrogen, a concentration of oxygen included in the second atmosphere being 3 volume % or less, wherein a concentration of nitrogen included in the first film after the second heat treatment is not less than $1 \times 10^{20}$ cm$^{-3}$ and not more than $1 \times 10^{22}$ cm$^{-3}$, wherein a thickness of the first film before the first heat treatment is not less than 40 nm and not more than 60 nm.

2. The method according to claim 1, wherein the first film is formed by chemical vapor deposition.

3. The method according to claim 1, further comprising depositing the first film on the semiconductor member.

4. The method according to claim 1, wherein a concentration of oxygen in the first atmosphere is 5 volume % or more.

5. The method according to claim 1, further comprising setting a temperature of the first film to a third temperature between the first heat treatment and the second heat treatment, the third temperature being lower than the first temperature.

6. The method according to claim 1, further comprising forming a conductive film on the first film after the second heat treatment.

7. The method according to claim 1, wherein the second atmosphere includes oxygen.

8. The method according to claim 1, wherein the first film is deposited on the semiconductor member.

9. The method according to claim 1, wherein a distance between an interface and a first position is not less than 0 nm and not more than 10 nm, the interface is between the first film and the semiconductor member, and a peak concentration is obtained at the first position.

10. The method according to claim 9 wherein a concentration of nitrogen at a second position included in the first film after the second heat treatment is less than a half of the peak concentration, a distance between the second position and the first position is 10 nm.

11. The method according to claim 1, wherein a first change rate of a first concentration of nitrogen in the semiconductor member is higher than a second change rate of a second concentration of nitrogen in the first film.

* * * * *